United States Patent
Mizuno

(10) Patent No.: US 10,004,168 B2
(45) Date of Patent: Jun. 19, 2018

(54) FEEDER EXCHANGING DEVICE

(71) Applicant: FUJI MACHINE MFG. CO., LTD., Chiryu (JP)

(72) Inventor: Takayuki Mizuno, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days. days.

(21) Appl. No.: 15/115,965

(22) PCT Filed: Feb. 14, 2014

(86) PCT No.: PCT/JP2014/053484
§ 371 (c)(1),
(2) Date: Aug. 2, 2016

(87) PCT Pub. No.: WO2015/121976
PCT Pub. Date: Aug. 20, 2015

(65) Prior Publication Data
US 2017/0172021 A1 Jun. 15, 2017

(51) Int. Cl.
*H05K 13/02* (2006.01)
*H05K 13/04* (2006.01)

(52) U.S. Cl.
CPC ....... *H05K 13/021* (2013.01); *H05K 13/0417* (2013.01)

(58) Field of Classification Search
CPC .................................................. H05K 13/0417
USPC ................... 29/740; 414/222.01, 222.05
See application file for complete search history.

(56) References Cited

U.S. PATENT DOCUMENTS

| 4,180,893 | A | * | 1/1980 | Avalon | ................... | H01L 24/86 |
| | | | | | | 257/E21.516 |
| 5,319,846 | A | | 6/1994 | Takahashi et al. | | |
| 5,456,001 | A | | 10/1995 | Mori et al. | | |
| 2009/0065149 | A1 | * | 3/2009 | Yamasaki | .............. | B26D 1/085 |
| | | | | | | 156/353 |

FOREIGN PATENT DOCUMENTS

JP 2005-123465 A 5/2005

OTHER PUBLICATIONS

Extended European Search Report dated Jan. 24, 2017 in Patent Application No. 14882198.6.
International Search Report dated Mar. 25, 2014 in PCT/JP2014/053484 filed Feb. 14, 2014.

* cited by examiner

*Primary Examiner* — Anna M Momper
*Assistant Examiner* — Ronald P Jarrett
(74) *Attorney, Agent, or Firm* — Oblon, McClelland, Maier & Neustadt, L.L.P.

(57) ABSTRACT

A feeder exchanging device capable of exchanging feeder provided with fixed blade and movable blade for cutting top film that is peeled from bottom tape as components are supplied to a component mounter. The feeder exchanging device comprises robot hand that includes pair of arms on which claws capable of clamping feeder are formed, and sliders that move robot hand in the X-axis, Y-axis, and Z-axis directions, with an actuator (rod actuator) for driving movable blade provided on robot hand.

6 Claims, 11 Drawing Sheets

FEEDER EXCHANGING DEVICE

TECHNICAL FIELD

The present disclosure relates to a feeder that supplies components to a component mounter and a feeder exchanging device that exchanges the feeder.

BACKGROUND ART

As a type of component supply device (feeder), devices are known (for example, refer to patent literature 1) that sequentially supply components to a component loading device (component mounter) by indexing component tape (carrier tape) formed from housing tape (bottom tape) that houses components and top tape (top film) affixed to the top of the housing tape, and peeling the top tape from the housing tape to expose the components in the housing tape. This component supply device is provided with an operating lever for removing the component supply device from a component supply stage, an ejection path for ejecting outside the machine housing tape from which the top tape has been peeled off and the component removed, and a blade mechanism (cutter) provided at the exit of the ejection path. The blade mechanism works in conjunction with the operating lever, such that when an operator operates the operating lever so as to remove the component supply device from the component supply stage, the blade mechanism cuts the housing tape that is protruding outside from the exit of the ejection path.
Patent literature 1: JP-A-2005-123465

SUMMARY

However, although cutting and collecting the housing tape (bottom tape) by working in conjunction with the operating lever is disclosed in patent literature 1, there is no mention of collection of the top film. As a conventional method for collecting top film, a winding method using a collecting reel provided on a frame is used. However, with this method the collection reel must be exchanged every time it becomes full, thus the load on operators is increased. Also, with this method, space for providing the collection reel is required, resulting in a problem that the feeder must be made larger. To resolve these problems, as a method for collecting top film, a method that consecutively indexes the top film into a collection container by indexing roller is known. However, with both methods, an operator must cut the top film when feeders are exchanged.

In recent years, feeder exchanging devices that automatically exchange feeders using a robot hand instead of having an operator perform feeder exchange work have been proposed. Feeder exchanging devices obviate the need for an operator to perform exchange work by automatically exchanging feeders. However, because an operator still needs to perform cutting work of top film when feeders are exchanged, it is not possible to sufficiently reduce the load on operators by simply introducing a feeder exchanging device.

An object of the present disclosure is to reduce work load on an operator with respect to a feeder capable of supplying components to a mounter unit.

The present disclosure using the following means to achieve the above object.

The feeder exchanging device of the present disclosure is capable of exchanging a feeder loaded on a feeder stand within a component mounting system provided with a feeder including a tape indexing section that indexes carrier tape configured from a tape main body in which multiple cavities housing a component are formed and film covering the multiple cavities and a peeling section that peels the film from the tape main body such that the component housed in the cavity can be removed, the feeder stand to and from which the feeder can be loaded and unloaded, and a mounter unit that picks up the component supplied by the feeder loaded on the feeder stand and mounts the component on a target object, and the feeder exchanging device comprises: a feeder housing section capable of housing multiple feeders; a moving member capable of moving between the feeder housing section and the feeder stand; and a gripping device that is provided on the moving device and that grips the feeder, wherein the moving member includes at least a portion of configuration elements that configure a film cutting device that cuts film peeled by the peeling section.

The feeder exchanging device of the present disclosure is provided with a feeder housing section capable of housing multiple feeders, a moving member capable of moving between the feeder housing section and a feeder stand, and a gripping device that grips the feeder. Also, the moving member includes the gripping device, and at least a portion of configuration elements that configure a film cutting device that cuts film peeled by the peeling section. By this, when the moving member is moved to the feeder stand and the gripping device provided on the moving member grips the feeder and removes the feeder from the feeder stand, the film is cut. Also, because automatic exchange of feeders is possible by moving the moving member to the feeder stand after moving the moving member from the feeder stand to the feeder housing section with the gripping device gripping the feeder and gripping a feeder housed in the housing feeder section with the gripping device, it is not necessary for an operator to exchange feeders manually. As a result, the work load on the operator is greatly reduced.

For the feeder exchange device of the present disclosure, the film cutting device may include, as the configuration elements, a cutter capable of cutting the film and an actuator that drives the cutter, the cutter may be provided on the feeder, and the actuator may be provided on the moving member. Accordingly, compared to a case in which all the configuration elements of the film cutting device are integrated in the feeder, the size of the feeder can be kept down.

Also, with the feeder exchanging device of the present disclosure, the feeder may be provided with a clamp mechanism switchable between a fixed state and a released state with the feeder stand, an operating member, a first converting mechanism that converts operation of the operating member to operation of the clamp mechanism, and a second converting mechanism that converts operation of the operating member to operation of the cutter, and the actuator may move the operating member in a state with the gripping device gripping the feeder. Accordingly, removing the feeder from the feeder stand and cutting the film peeled from the tape main body is performed by a single actuator, so compared to a case in which a separate actuator is used for each of removing the feeder and cutting the film, the gripping device can be made smaller. Note that, the operating member may be configured to be able to be operated manually by an operator.

Further, with the feeder exchanging device of the present disclosure, the cutter may cut the film by a stroke of a movable blade, the second converting mechanism may be a link mechanism joining the operating member and the movable blade, and at least one joining section of the link mechanism may be joined such that movable blade is relatively movable within the stroke range. Accordingly, the film may be cut with the movable blade being moved along a stroke independently, without the need to operate the operating member. That is, it is possible to cut the film at a period different to the exchange period of the feeder.

DETAILED DESCRIPTION

An embodiment of the present disclosure is described below.

Figure 1:
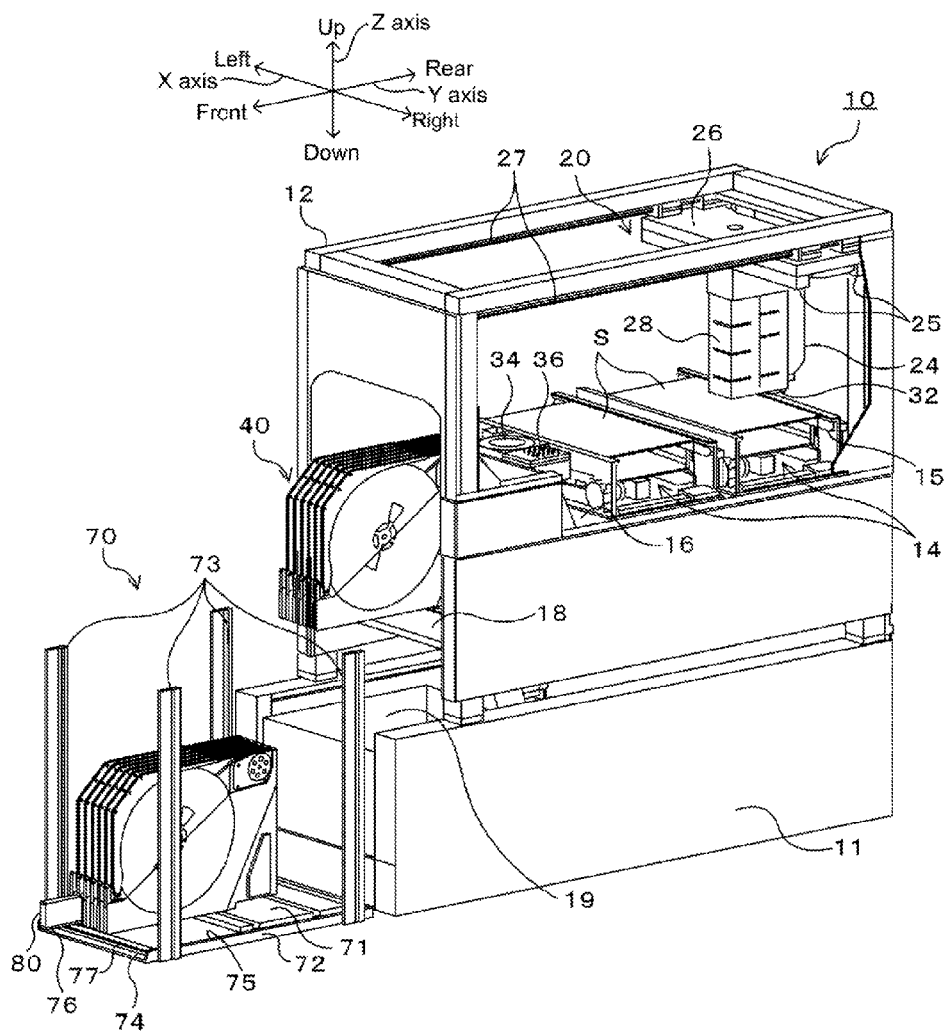
FIG. 1 shows the overall configuration of a component mounting system.
Figure 2:
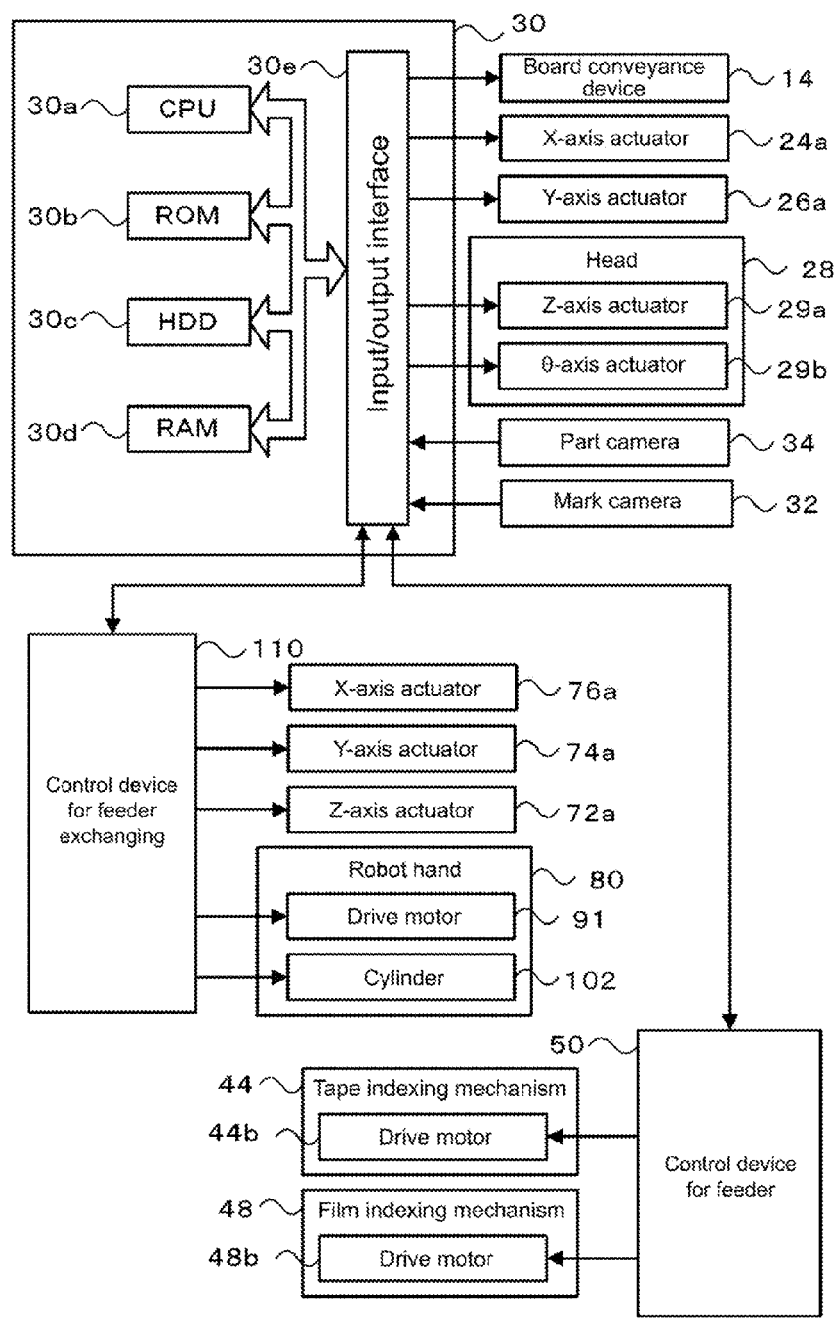
FIG. 2 is a block diagram showing the electrical connections between control device 30 of component mounter 10, feeder control device 50, and feeder exchanging device control device 110.

FIG. 1 shows the overall configuration of a component mounting system, and FIG. 2 is a block diagram showing the electrical connections between control device 30 of component mounter 10, feeder control device 50, and feeder exchanging device control device 110. Note that, for the present embodiment, in FIG. 1, the left/right direction is the X-axis direction, the front/rear direction is the Y-axis direction, and the up/down direction is the Z-axis direction.

As shown in FIG. 1, the component mounting system is provided with feeder 40 as a component supply device that supplies components, component mounter 10 that picks up electronic components (also referred to as simply as "components") supplied by feeder 40 and mounts them on circuit board (also referred to as simply as ("board") S, and feeder exchanging device 70, which is an embodiment of the present disclosure, that automatically exchanges feeders 40 loaded on component mounter 10.

As shown in FIG. 1, component mounter 10 is provided with board conveyance device 14 that conveys board S, a backup device (not shown) that backs up board S conveyed by board conveyance device 14, component mounting device 20 that picks up components P supplied by feeder 40 and mounts them on board S backed up the backup device, and component mounter control device 30 (refer to FIG. 2) that performs overall control of the component mounter. Board conveyance device 14, the backup device, and component mounting device 20 are housed inside main body frame 12 provided on base 11. Also, feeder stand 18 to and from which feeders 40 are loadable and unloadable is provided at the front of main body frame 12.

Figure 3:
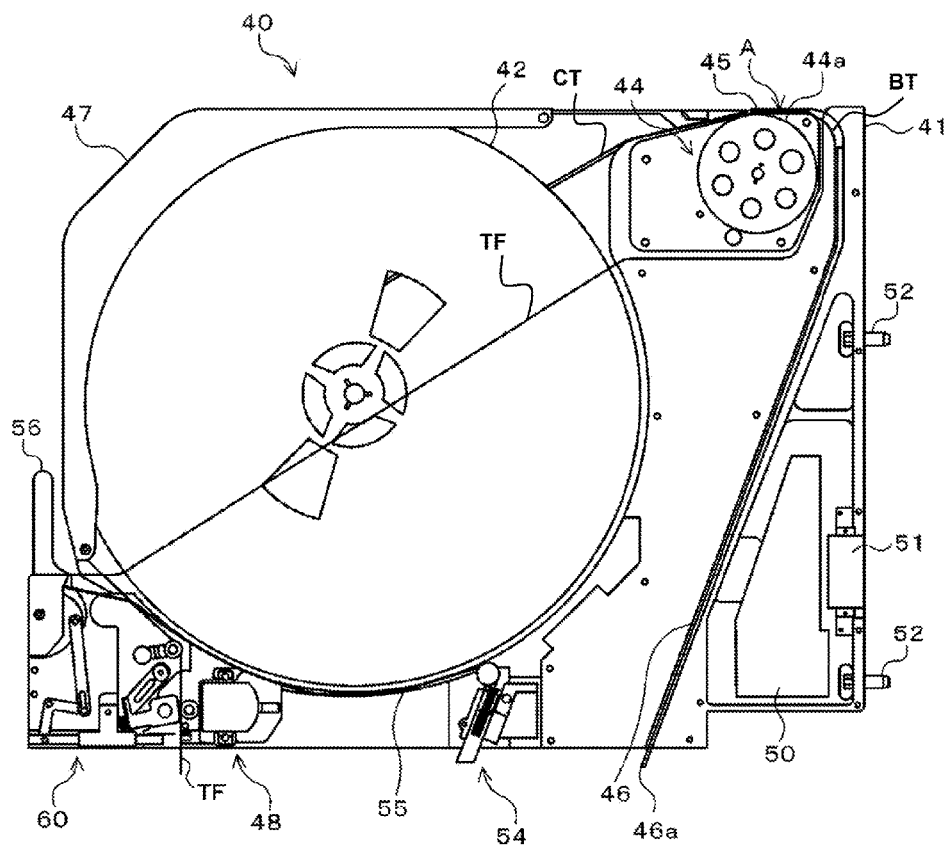
FIG. 3 shows the overall configuration of feeder 40.
Figure 4:
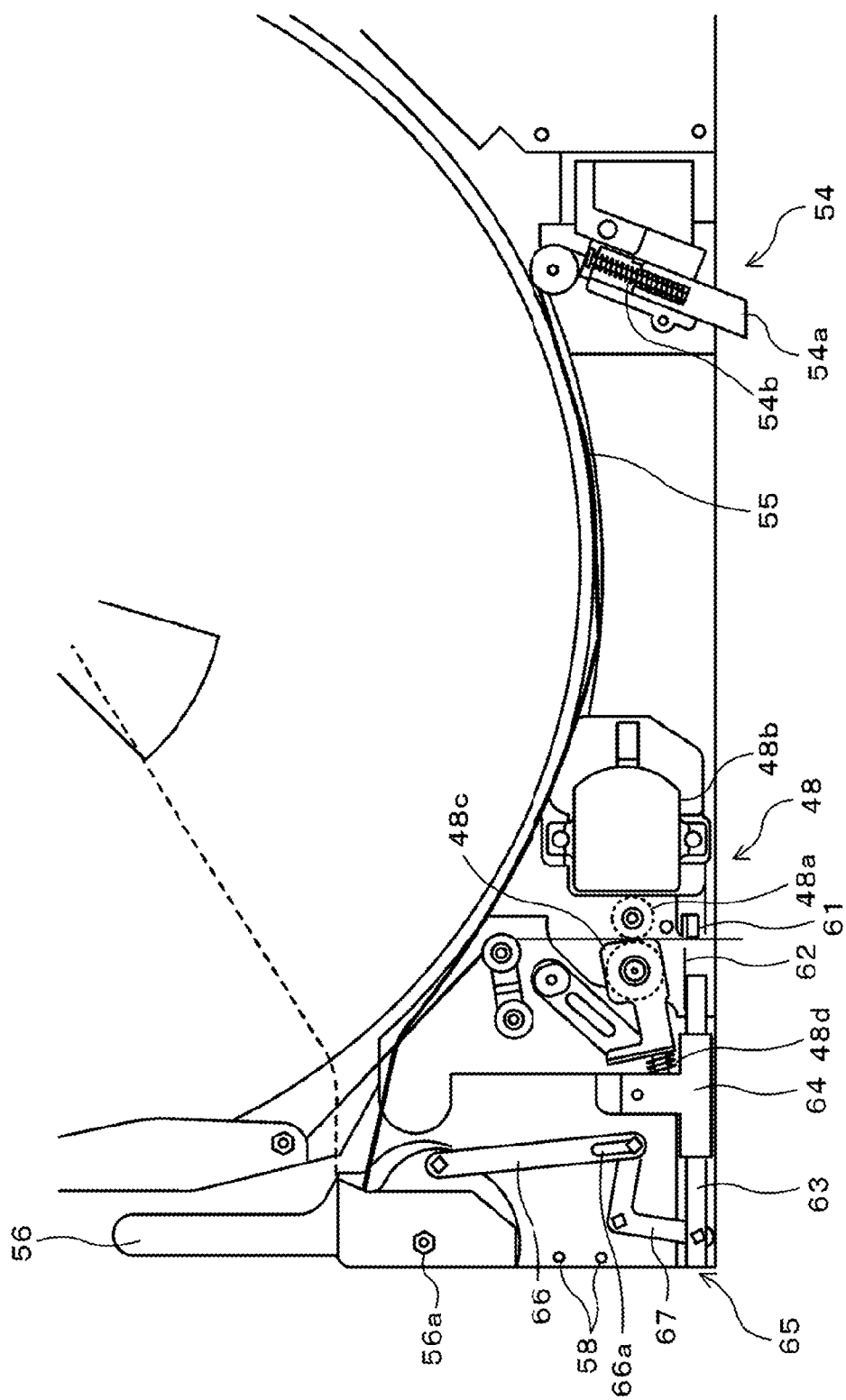
FIG. 4 shows an enlarged view of a lower portion of feeder 40.

Feeder 40 is a tape feeder that indexes carrier tape CT that houses components P at a specified pitch to component supply position A at which pickup by component mounter 10 is possible. Carrier tape CT is configured from bottom tape BT in which cavities (recesses) are formed at a specified pitch lengthwise, and top film TF that covers the surface of bottom tape BT with a component P housed in each of the cavities. FIGS. 3 and 4 show the overall configuration of feeder 40. As shown in the figures, feeder 40 is configured as a cassette-type feeder formed with an approximately rectangular case 41, and is provided with tape reel 42 around which carrier tape CT is wound, tape indexing mechanism 44 that pulls out carrier tape CT from tape reel 42 and indexes it to component supply position A, film peeling section 45 provided in front of component supply position A that peels top film TF from bottom tape BT such that component P is exposed (such that component P is able to be picked up), tape duct 46 that guides bottom tape BT to outlet 46a formed at a lower section of case 41 after top film TF has been peeled by film peeling section 45 and component P has been picked up, film guide 47 in which a groove is formed that guides top film TF peeled by film peeling section 45 downwards along the outer circumference of case 41, film indexing mechanism 48 that indexes top film TF down along film guide 47, and film cutting mechanism 60 that cuts top film TF that has been indexed by film indexing mechanism 48. Top film TF that has been cut by film cutting mechanism 60 is collected in waste box 19 provided on base 11. Also, bottom tape BT ejected from outlet 46a is collected in waste box 19 after being cut up finely by a tape cutting mechanism, not shown, provided under outlet 46a.

Tape indexing mechanism 44 is provided with sprocket 44a for tape indexing, and drive motor 44b for intermittently rotating sprocket 44a. Engaging claws that engage with the engaging holes formed at specified intervals in carrier tape CT are provided on the outer circumference of sprocket 44a. Tape indexing mechanism 44 pitch indexes carrier tape CT forward by intermittently rotating sprocket 44a using drive motor 44b with carrier tape CT engaged with sprocket 44a.

Film indexing mechanism 48 is provided with drive roller 48a for indexing film, drive motor 48b that rotates drive roller 48a, and driven roller 48c that rotates based on the rotation of drive roller 48a due to being pressed against drive roller 48a by the biasing force of spring 48d. Teeth that sandwich top film TF are provided on the outer circumference of drive roller 48a and driven roller 48c. Film indexing mechanism 48 indexes top film TF downwards by drive roller 48a being rotated by drive motor 48b with top film TF sandwiched between drive roller 48a and driven roller 48c. Film cutting mechanism 60 that cuts top film TF is provided below film indexing mechanism 48.

Also, feeder 40 is provided with clamp mechanism 54 linked to the inclining operation of clamp lever 56 that is attachable and detachable with respect to feeder stand 18, and positioning pin 52 formed at the right end surface in FIG. 3 that decides the position when loading the feeder on feeder stand 18. Clamp mechanism 54 is provided with clamp pin 54a provided on case 41 slanted downwards to the left as in FIG. 3 on the bottom surface of case 41 so as to be able to advance and retract, and spring 54b that biases clamp pin 54a in the forward direction. The rear end of clamp pin 54a is connected to an end of wire 55, and clamp lever 56 is connected to the other end of wire 55 at a position separated from fulcrum 56a of clamp lever 56. Thus, when clamp lever 56 is tilted, clamp pin 54a is inserted inside case 41 by being pulled by wire 55 based on the compression of spring 54. Conversely, when the tilting of clamp lever 56 is released, clamp pin 54a protrudes outside of case 41 due to the biasing force of spring 54b. At the same time, clamp lever 56 is pulled by wire 55 based on the biasing force of spring 54b and returns from the tilted state to an upright state. Although not shown in the figures, feeder stand 18 is formed with a first support surface that supports feeder 40 at the right end surface as in FIG. 3, and a second support surface that supports feeder 40 from below. A positioning pin hole into which positioning pin 52 of feeder 40 is inserted is provided in the first support surface, and a clamp pin hole, in which clamp pin 54a is engaged when clamp pin 54a protrudes outside case 41 with positioning pin 52 inserted into the positioning pin hole, is provided in the second support surface. By this, after loading feeder 40 with clamp lever 56 tilted (with clamp pin 54b pulled inside case 41) such that positioning pin 52 is inserted into the positioning pin hole on feeder stand 18, when the tilt of clamp lever 56 is released, clamp pin 54a protrudes from case 41 and engages with the clamp pin hole, and the right end surface as in FIG. 3 of feeder 40 is pressed against the first support surface of feeder stand 18 by the elastic force of spring 54a that biases clamp pin 54a. Thus, feeder 40 is fixed to feeder stand 18 by positioning pin 52. Conversely, when clamp lever 56 is tilted from an upright position, clamp pin 54a is removed from the clamp pin hole of feeder stand 18. Thus, the fixing of feeder 40 is released and feeder 40 is able to be removed from feeder stand 18.

Film cutting mechanism 60 is a mechanism for cutting top film indexed by film indexing mechanism 48 that works in conjunction with the tilting operation of clamp lever 56. As shown in FIG. 4, film cutting mechanism 60 is provided with fixed blade 61 fixed to case 41, movable blade 62 that faces fixed blade 61 and that sandwiches top film TF, rod 63 to which movable blade 62 is attached that is able to move forward/backward in a straight line (the up/down direction in FIG. 4), and link mechanism 65 that converts the oscillating motion of clamp lever 56 around fulcrum 56a as an axis (tilting operation of clamp lever 56) to straight line forward/backward movement of rod 63. One end of rod 63 is attached to movable blade 62 and is supported by support member 64 so as to be movable forward/backward in a straight line. Link mechanism 65 is configured from rod-shaped first link member 66 and approximately L-shaped second link member 67. One end of rod-shaped first link member 66 is connected to clamp lever 56 at a position separated from fulcrum 56a. L-shape second link member 67 is capable of oscillating movement around the point where it is bent as a fulcrum, with the first end of L-shape second link member 67 connected to the other end of first link member 66, and the other end of L-shape second link member 67 connected to the other end of rod 63. Thus, by the tilting of clamp lever 56, film cutting mechanism 60 is moved in a stroke such that movable blade 62 meshes with fixed blade 61 via link mechanism 65. As described above, if clamp lever 56 is tilted, the fixing of feeder 40 to feeder stand 18 is released, thus feeder 40 can be removed and top film TF can be cut at the same time. Note that, elongated hole 66a is formed in the other end of first link member 66, and the other end of first link member 66 and the first end of second link member 67 are connected capable of relative movement within the range of the length of elongated hole 66a. Thus, it is possible to move movable blade 62 (rod 63) in a stroke independently without operating clamp lever 56. That is, it is possible to cut top film TF by moving movable blade 62 while feeder 40 remains loaded on feeder stand 18.

Also, feeder 40 is provided with feeder control device 50 that performs overall control. Feeder control device 50 is configured from a microprocessor including a CPU, ROM, RAM and so on, and as shown in FIG. 2, outputs drive signals to drive motor 48b of tape indexing mechanism 44 and drive signals to drive motor 48b of film indexing mechanism 48. Also, feeder control device 50 is connected to component mounter control device 30 via connector 51 such that communication is possible. Note that, in the present embodiment, connector 51 is configured as an electric power connector that receives electric power from component mounter 10 and supplies electric power to each of tape indexing mechanism 44 (drive motor 44b), film indexing mechanism 48 (drive motor 48b), feeder control device 50, and so on.

As shown in FIG. 1, board conveyance device 14 is configured as a dual lane type conveyance device provided with two board conveyance paths, and is arranged on support table 16 provided on a central level section of main body frame 12. Each board conveyance path is provided with belt conveyor device 15, and board S is conveyed from the left to the right in FIG. 1 (board conveyance direction) by the driving of belt conveyor device 15.

As shown in FIG. 1, component mounting device 20 is provided with guide rails 27 attached to an upper level section of main body frame 12 along the Y-axis direction, Y-axis slider 26 movable along guide rails 27, guide rails 25 attached to the bottom surface of Y-axis slider 26 along the X-axis direction, X-axis slider 24 movable along the X-axis direction, head 28 attached to X-axis slider 24 movable in the XY-axis directions, a suction nozzle, not shown, that is attached to head 28 capable of movement in the Z-axis direction and rotation around the Z-axis and that is able to pick up a component, part camera 34 provided on support table 16 for capturing an image of a component picked up by the suction nozzle, mark camera 32 attached to X-axis slider 24 for capturing an image of a board positioning reference mark provided on board S, and nozzle stocker 36 that stocks multiple types of suction nozzles that can be attached to head 28.

Component mounter control device 30 is configured from a microprocessor based around CPU 30a, and is also provided with ROM 30b that memorizes a processing program, HDD 30c that memorizes various data, RAM 30d used as working memory, and input/output interface 30e. Image signals from mark camera 32, image signals from part camera 34, and so on are inputted into component mounter control device 30 via input/output interface 30e. Also, control signals to board conveyance device 14, drive signals to X-axis actuator 24a that moves X-axis slider 24, drive signals to Y-axis actuator 26a that moves Y-axis slider 26, drive signals to Z-axis actuator 29a that is built into head 28 and that moves the suction nozzle in the Z-axis direction, drive signals to θ-axis actuator 29b that is built into head 28 and that rotates the suction nozzle, and drive signals to an electromagnetic valve that performs connection and disconnection of the suction nozzle with a vacuum pump, not shown, are output from component mounter control device 30 via input/output interface 30e. Also, component mounter control device 30 is connected to feeder control device 50 and feeder exchanging device control device 110, described later, such that communication is possible, and performs communication of data and control signals between the respective items.

As shown in FIG. 1, feeder exchanging device 70 of the present embodiment is provided with housing stand 71 capable of housing multiple feeders 40, four guide rails 73 provided standing up in the Z-axis direction at the four corners of housing table 71, Z-axis slider 72 as a rectangular frame capable of movement along guide rails 73, guide rails 75 provided on an inside surface of Z-axis slider 72 along the Y-axis direction, rectangular plate-shaped Y-axis slider 74 capable of movement along guide rails 75, guide rails 77 formed on an upper surface of Y-axis slider 74 along the X-axis direction, Z-axis slider 76 capable of movement along guide rails 77, robot hand 80 provided on an upper surface of X-axis slider 76 capable of clamping feeder 40, and feeder exchanging device control device 110 (refer to FIG. 2) that performs overall device control. That is, feeder exchanging device 70 is able to move feeder 40 in the X-axis direction, Y-axis direction, and Z-axis direction by moving each of X-axis slider 76, Y-axis slider 74, and Z-axis slider 72 with feeder 40 clamped by robot hand 80.

Figure 5:
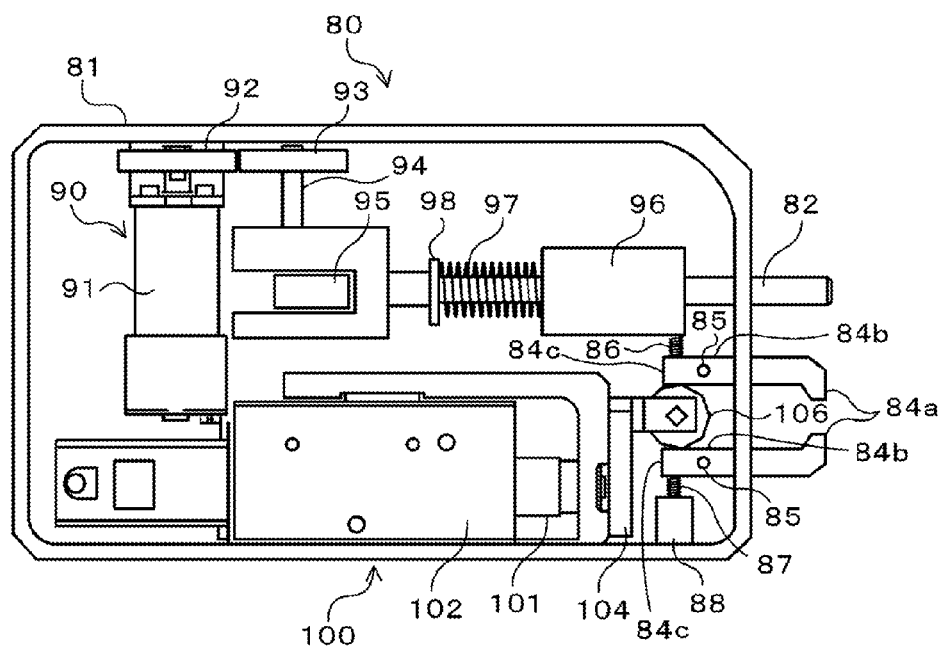
FIG. 5 shows the overall configuration of robot hand 80.

FIG. 5 shows the overall configuration of robot hand 80. As shown, robot hand 80 is provided with rod 82 capable of being advanced and retracted in the Y-axis direction, rod actuator 90 that drives rod 82, pair of arms 84, and arm actuator 100 that opens and closes the pair of arms 84.

Rod actuator 90 is provided with drive motor 91 capable of rotation driving, rotation axis 94 connected to the rotating axis of drive motor 91 via gears 92 and 93, cam 95 connected to rotation axis 94 in an offset manner that converts the rotation movement of rotation axis 94 to forward/backward straight line movement of rod 82, support member 96 fixed to case 81 that supports rod 82 so as to be capable of forward/backward straight line movement, and spring 97 that biases rod 82 in the retraction direction, one end of which contacts support member 96 and the other end of which contacts spring receiver 98 that is connected to rod 82.

Arm actuator 100 is provided with cylinder 102 including piston rod 101, slider 104 fixed to piston rod 101, and stopper 106 attached to slider 104. Pair of arms 84 have a claw formed on each end section 84a, and are capable of oscillation around a fulcrum of support axis 85 that supports intermediate section 84b. Also, with pair of arms 84, each base section 84c is biased closed by spring 86 supported on support member 96 and spring 87 supported on support member 88. Thus, the tip sections 84a of pair of arms 84 are biased open by the biasing force of springs 86 and 87. Stopper 106 is capable of being slid while sandwiched between pair of arms 84, and when piston rod 101 is pushed out by cylinder 102, stopper 106 is moved to center sections 84b of arms 84. Accordingly, because springs 86 and 87 extend, tip sections 84a (claws) of arms 84a open. Conversely, stopper 106 moves to base sections 84c of arms 84 when piston rod 101 is withdrawn by cylinder 102. Accordingly, because stopper 106 prevents the extending of springs 86 and 87, tip sections 84a (claws) of arms 84 close. Tip sections 84a (claws) of pair of arms 84 are thus opened and closed by the driving of cylinder 102.

Feeder exchanging device control device 110 is configured from a microprocessor including a CPU, ROM, RAM and so on, and as shown in FIG. 2, outputs drive signals to X-axis actuator 76a that moves X-axis slider 76, drive signals to Y-axis actuator 74a that moves Y-axis slider 74, drive signals to Z-axis actuator 72a that moves Z-axis slider 72, drive signals to drive motor 91 and cylinder 102 of robot hand 80, and so on. Also, feeder exchanging device control device 110 is connected to component mounter control device 30 such that communication is possible and communication of data and control signals is performed between these items.

Figure 6A:
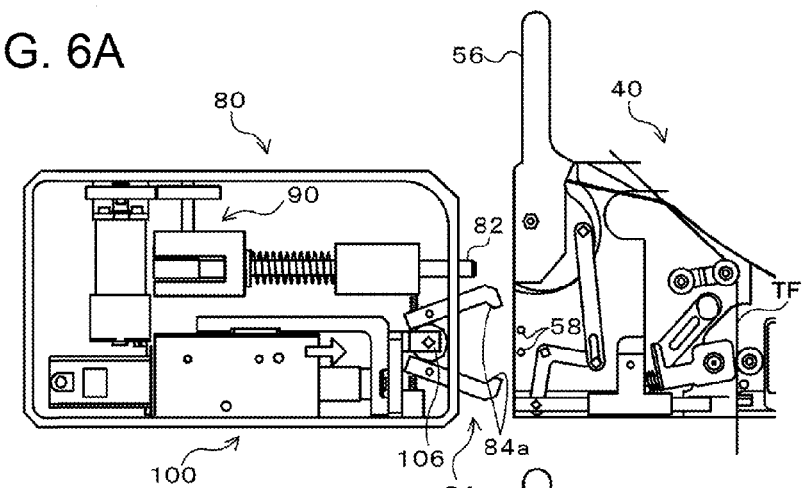
FIGS. 6A, 6B and 6C show feeder 40 being removed from a feeder stand by robot hand 80.
Figure 6B:
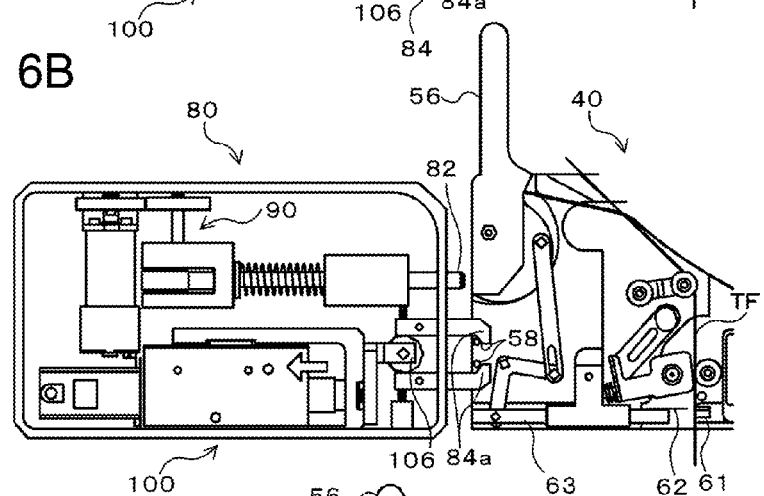
Figure 6C:
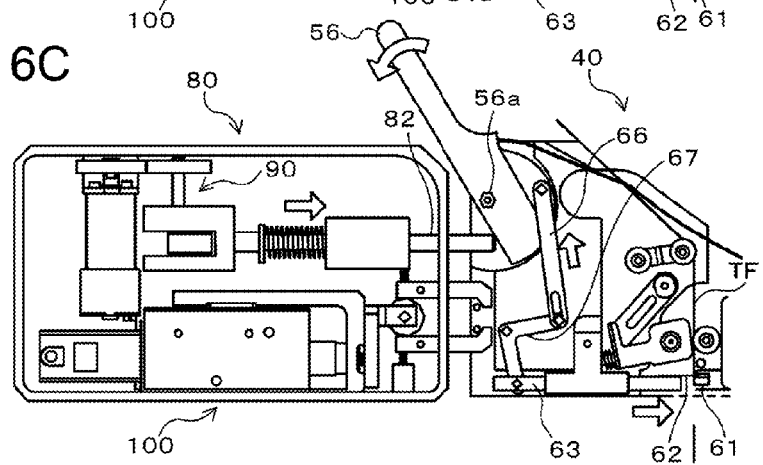

FIGS. 6A, 6B, and 6C show feeder 40 being removed by robot hand 80. Removing of feeder 40 is performed as follows. First, feeder exchanging device control device 110 opens the claws of tip sections 84a by controlling arm actuator 100 such that stopper 106 is moved to center sections 84b of arms 84. Next, feeder exchanging device control device 110 moves robot hand 80 in front of feeder 40 by controlling X-axis actuator 76a, Y-axis actuator 74a, and Z-axis actuator 72a, and then closes the claws of tip sections 84a by controlling arm actuator 100 such that stopper 106 is moved to base sections 84c of arms 84, by which the claws hook around engaging pins 58 formed on feeder 40. By this, feeder 40 is clamped by robot hand 80. Then, feeder exchanging device control device 110 advances (moves to the right in FIG. 6C) rod 82 by controlling rod actuator 90, and tilts clamp lever 56 by contacting clamp lever 56 under fulcrum 56a. As described earlier, when clamp lever 56 is tilted, the fixing of feeder 40 by clamp mechanism 54 is released, and top film TF sandwiched between fixed blade 61 and movable blade 62 is cut by movable blade 62 being moved in a stroke to mesh with fixed blade 61.

Also, exchange work of feeder 40 after a used feeder 40 has been removed from feeder stand 18 is performed as follows. Feeder exchanging device control device 110 moves feeder 40 to an empty space on housing table 71 by controlling X-axis actuator 76a, Y-axis actuator 74a, and Z-axis actuator 72a with feeder 40 in a clamped state. Then, feeder exchanging device control device 110 opens the claws of tip sections 84a by controlling arm actuator 100 such that stopper 106 is moved to center sections 84b of arms 84, by which the clamping of feeder 40 by robot hand 80 is released. Thus, used feeder 40 is housed on housing table 71. Further, feeder exchanging device control device 110 moves robot hand 80 in front of a new feeder 40 by controlling X-axis actuator 76a, clamps the feeder 40 by controlling arm actuator 100, and tilts clamp lever 56 being controlling rod actuator 90. When robot hand 80 has clamped feeder 40, feeder exchanging device control device 110 moves the new feeder 40 to feeder stand 80 by controlling X-axis actuator 76a, Y-axis actuator 74a, and Z-axis actuator 72a. Further, feeder exchanging device control device 110 releases the tilting of clamp lever 56 by controlling rod actuator 90. By this, the new feeder 40 is fixed to feeder stand 18 by clamp mechanism 54.

According to the present embodiment described above, feeder exchanging device 70 exchanges feeders 40 provided with fixed blade 61 and movable blade 62 for cutting top film TF that is peeled from bottom tape BT as components are supplied, and is provided with robot hand 80 that includes pair of arms 84 on which claws capable of clamping feeder 40 are formed, X-axis slider 76 that moves robot hand 80 in the X-axis direction, Y-axis slider 74 that moves robot hand 80 in the Y-axis direction, and Z-axis slider 72 that moves robot hand 80 in the Z-axis direction, with robot hand 80 being provided with an actuator (rod actuator 90) for driving movable blade 62. By this, when feeders 40 are exchanged, top film TF is also cut, thus it is not necessary for an operator to cut top film TF, reducing the load on the operator. Further, because with the feeder exchanging device of the present embodiment feeders 40 are exchanged automatically by robot hand 80, it is not necessary for an operator to exchange feeders 40, reducing the load on the operator even more.

Also, in the present embodiment, feeder 40 is provided with wire 55 that connects clamp lever 56 and clamp mechanism 54, and link mechanism 65 that connects clamp lever 56 and movable blade 62. Thus, even when tilting operation of clamp lever 56 is performed by an operator, top film TF is cut at the same time as the releasing of the fixing of feeder 40. In this case too, robot hand 80 only need be provided with rod actuator 90 capable of tilting clamp lever 56 via rod 82 as a driving item that drives movable blade 62, thus driving items for movable blade 62 have a simple configuration and robot hand 80 can be made smaller.

Figure 7:
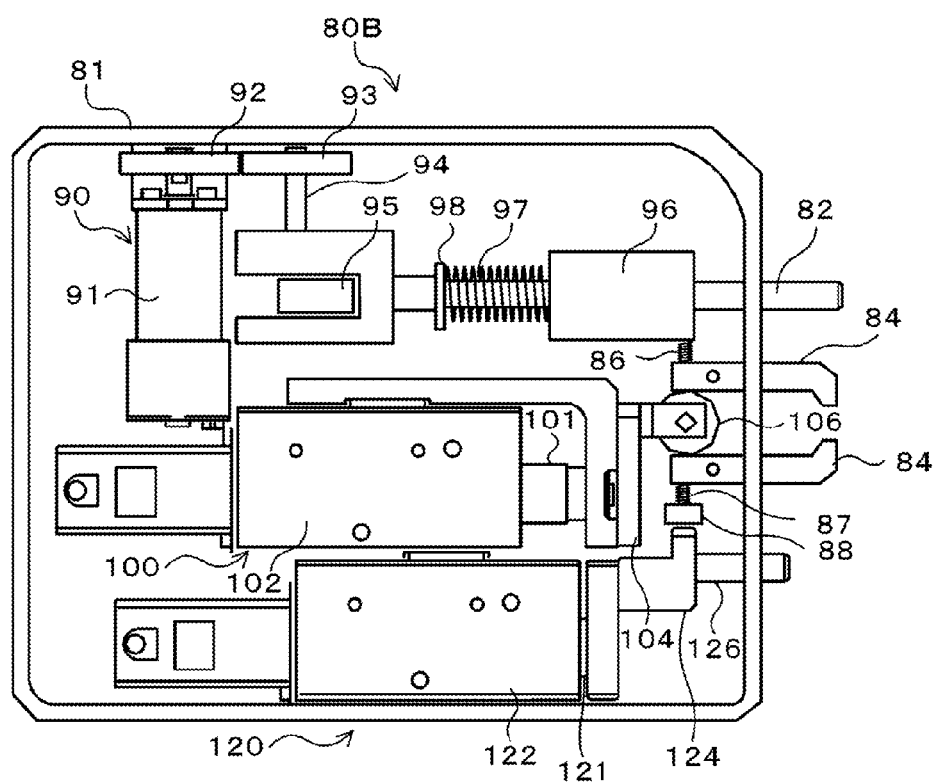
FIG. 7 shows the overall configuration of an alternative robot hand, robot hand 80B.

Further, feeder 40 of the present embodiment is provided with, as link mechanism 65, first link member 66 that is connected to clamp lever 56, and second link member 67 that is connected to rod 63 and first link member 66. Also, first link member 66 and second link member 67 are joined via elongated hole 66a such that they are relatively movable within the stroke range of movable blade 62 (rod 63). Thus, it is possible to cut top film TF by moving movable blade 62 while feeder 40 remains loaded on feeder stand 18. In this case, the robot hand may be provided separately with an actuator for tilting clamp lever 56 and an actuator for moving movable blade in a stroke. FIG. 7 shows the overall configuration of an alternative robot hand, robot hand 80B. As shown, robot hand 80B of the alternative embodiment is provided with rod actuator 90 and arm actuator 100 similar to robot hand 80, and is also provided with second rod actuator 120 that moves movable blade 62 (rod 63) of feeder 40 back and forth. As shown, second rod actuator 120 is provided with cylinder 122 including piston rod 121, slider 124 fixed to piston rod 121 capable of back and forth movement due to the driving of cylinder 122, and rod 126 attached to slider 124.

Figure 8:
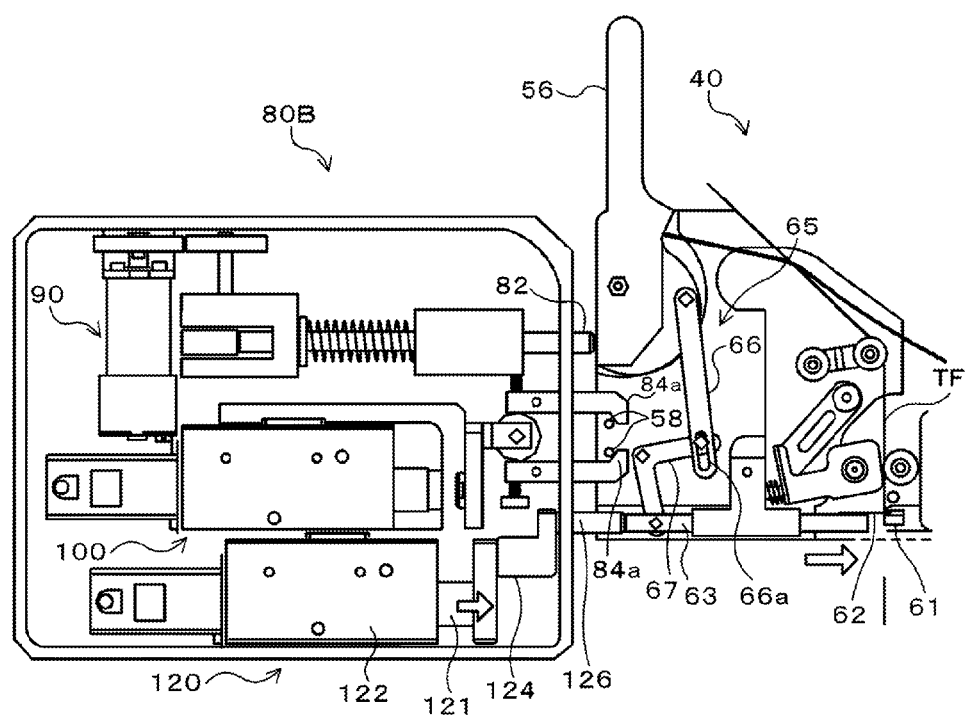
FIG. 8 shows the state when top film TF is cut by robot hand 80B.

FIG. 8 shows the state when top film TF is cut by robot hand 80B. The cutting of top film TF is performed as follows. Robot hand 80B drives arm actuator 100 such that the claws of tip sections 84a of arms 84 hook around engaging pins 58 of feeder 40, thereby clamping feeder 40. Further, robot hand 80B drives second rod actuator 120 such that rod 126 is advanced (moved to the right in FIG. 8), thereby pushing movable blade 62 with rod 63. By this, movable blade 62 is moved to a position meshing with fixed blade 61, such that top film TF sandwiched between fixed blade 61 and movable blade 62 is cut.

Here, when feeder 40 is loaded on feeder stand 18, component mounter 10 performs position deviation checking operation to check whether the loading position of feeder 40 is deviated by reading a reference mark provided on feeder 40 with mark camera 32. Thus, when position deviation check operation is performed, production is stopped until the position deviation check operation is complete. As described above, in a case in which top film TF is cut by the tilting of clamp lever 56, feeder 40 is removed from feeder stand 18. Thus, when feeder 40 is re-loaded on feeder stand 18, position deviation check operation is performed undesirably. Because robot hand 80B of the alternative embodiment is provided with second rod actuator 120 separate to rod actuator 90, it is possible to cut top film TF with feeder 40 remaining on feeder stand 18. By this, component mounter 10 avoids performing position deviation check operation needlessly, thus curtailing a drop in productivity.

The above embodiments were described such that the present disclosure took the form of a feeder exchanging device, but the present disclosure may take the form of a feeder (component supply device). That is, the present disclosure may be a feeder capable of being loaded and unloaded to and from a feeder stand, the feeder being provided with a tape indexing section that indexes carrier tape configured from a tape main body in which multiple cavities housing a component are formed and film covering the multiple cavities, a peeling section that peels the film from the tape main body such that the component housed in the cavity can be removed, a clamp mechanism that allows the feeder to be fixed to and released from a feeder stand, a cutter capable of cutting the film, an operating member capable of being operated by an operator, a first converting mechanism that converts operation of the operating member to operation of the clamp mechanism, a second converting mechanism that converts operation of the operating member to operation of the cutter, wherein the cutter cuts the film based on a stroke of the movable blade, the second converting mechanism is a link mechanism that connects the operating member and the movable blade, and at least one connecting section of the link mechanism is connected such that relative movement is possible within the stroke of the movable blade. Note that the feeder may be any type of feeder, and is not limited to a type (cassette type feeder) suitable for a feeder exchanging device.

Figure 9:
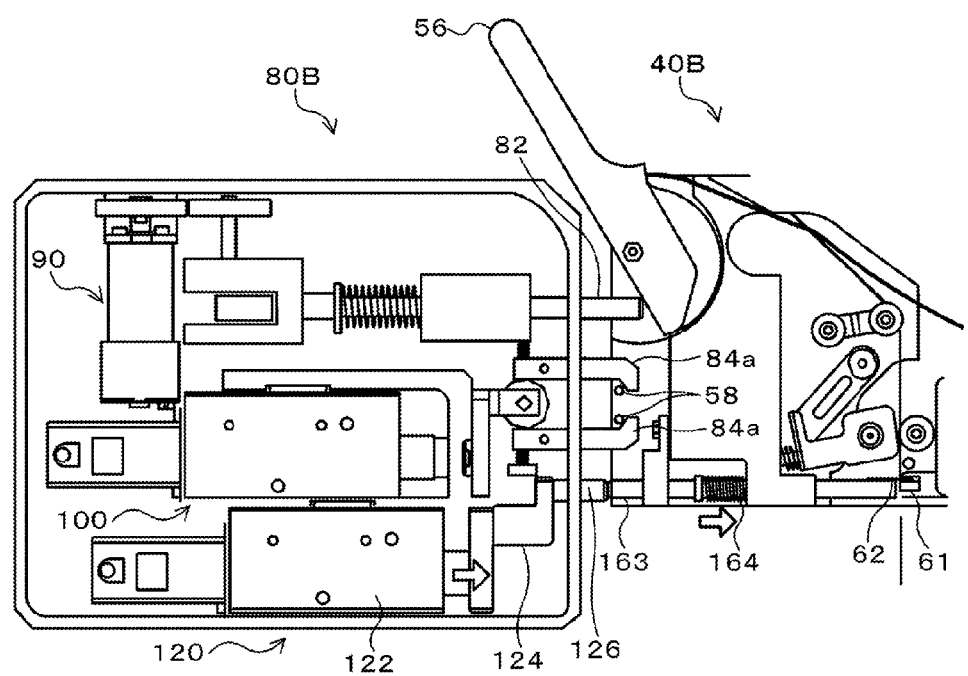
FIG. 9 shows feeder 40B being removed from a feeder stand by robot hand 80B.

Also, robot hand 80B of the alternative embodiment described above is applied to a feeder 40 for which the back and forth movement of movable blade 62 is possible linked to the tilting operation of clamp lever 56, but embodiments are not restricted to this, and may be applied to feeder 40B, which is a type in which clamp lever 56 and movable blade 62 are not linked. FIG. 9 shows an alternative embodiment feeder, feeder 40B, being removed from a feeder stand by the alternative embodiment robot hand 80B. Here, the alternative embodiment feeder 40B differs from feeder 40 of the first embodiment mainly in that feeder 40B does not have link mechanism 65, and has spring 164 that biases rod 163 to which movable blade 62 is fixed in a direction away from fixed blade 61. Removing of alternative embodiment feeder 40B is performed as follows. Similar to the first embodiment, robot hand 80B drives arm actuator 100 such that the claws of tip sections 84a of arms 84 hook around engaging pins 58 of feeder 40B, thereby clamping feeder 40B. Continuing, robot hand 80B drives rod actuator 90 such that rod 82 is advanced (moved to the right in FIG. 9), thereby tilting clamp lever 56. By this, the fixing of feeder 40B is released. Here, with alternative embodiment feeder 40B, clamp lever 56 is not linked to movable blade 62, so top film TF is not cut by the tilting of clamp lever 56. Further, robot hand 80B drives second rod actuator 120 such that rod 126 is advanced, thereby pushing movable blade 62 with rod 163. By this, movable blade 62 is moved to a position meshing with fixed blade 61, such that top film TF sandwiched between fixed blade 61 and movable blade 62 is cut.

Figure 10:
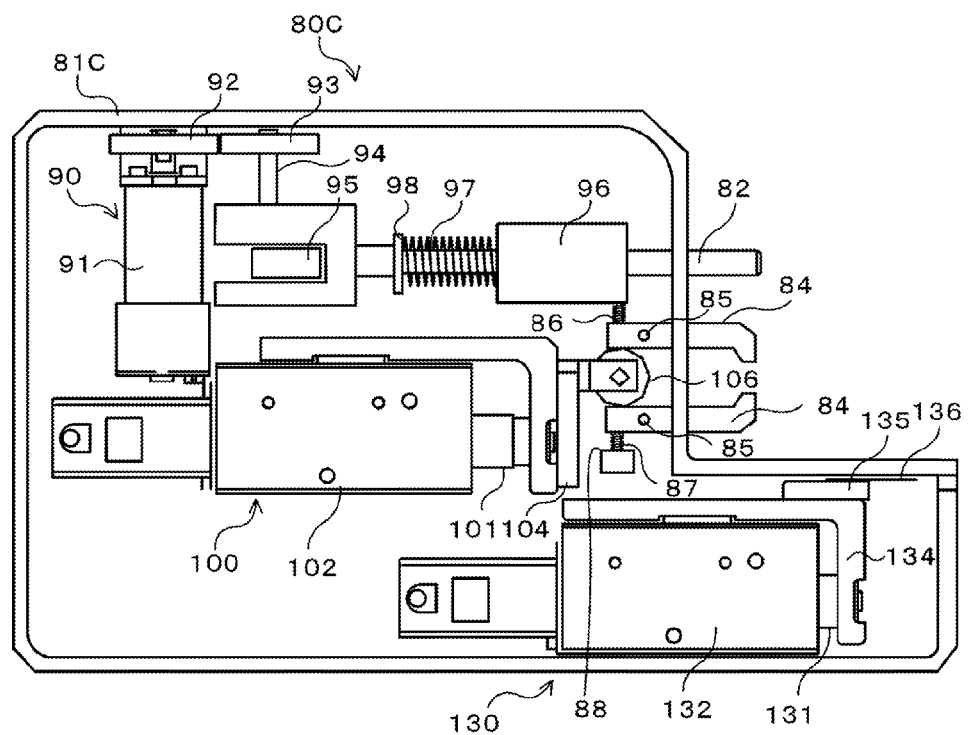
FIG. 10 shows the overall configuration of an alternative robot hand, robot hand 80C.

With feeder exchanging device 70 of the first embodiment, movable blade 62 for cutting top film TF is provided on feeder 40, and the actuator (rod actuator 90) for driving movable blade 62 is provided on robot hand 80, but embodiments are not limited to this, and both the movable blade and the actuator may be provided on the robot hand. FIG. 10 shows the overall configuration of an alternative robot hand, robot hand 80C. As shown, robot hand 80C of the alternative embodiment is provided with rod actuator 90 and arm actuator 100 similar to robot hand 80, and is also provided with movable blade 136 and third rod actuator 130 that moves movable blade 136 back and forth. Movable blade 136 protrudes in the advancing direction (to the right in FIG. 10) further than rod 82 and arm 84, and is able to be moved in a stroke to a position meshing with fixed blade 61 provided on feeder 40C while feeder 40C is in a state clamped by robot hand 80C. As shown, third rod actuator 130 is provided with cylinder 132 including piston rod 131, slider 134 fixed to piston rod 131 capable of back and forth movement due to the driving of cylinder 132, and support member 135 attached to movable blade 136. Support member 135 is fixed to slider 134 and moves movable blade 136 back and forth based on the back and forth movement of slider 134.

Figure 11:
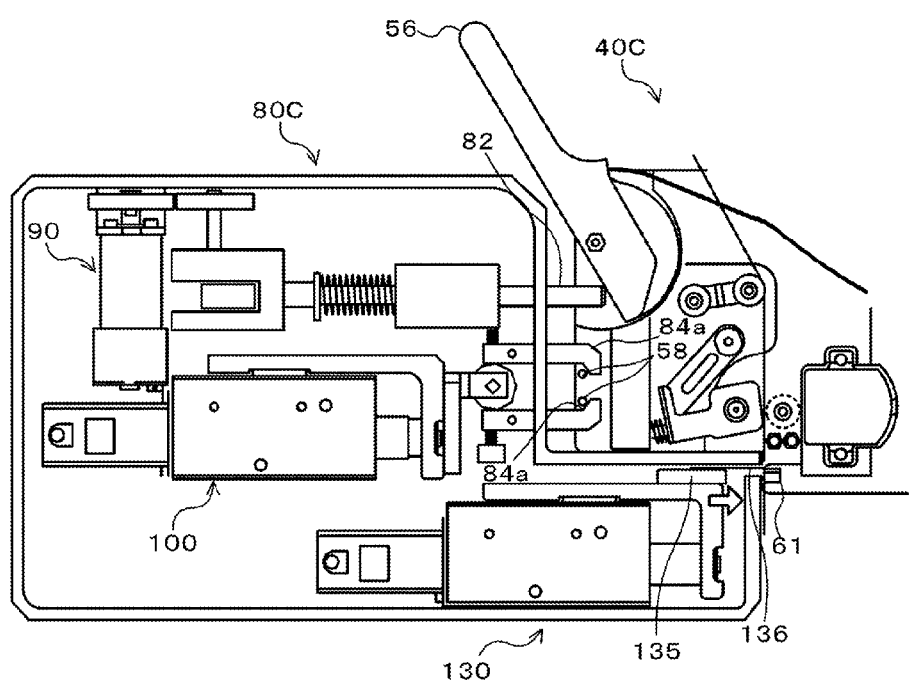
FIG. 11 shows feeder 40C being removed from a feeder stand by robot hand 80C.

FIG. 11 shows an alternative embodiment feeder, feeder 40C, being removed from a feeder stand by the alternative embodiment robot hand 80C. Here, the alternative embodiment feeder 40C differs from feeder 40 of the first embodiment mainly in that feeder 40C does not have link mechanism 65, does not have movable blade 62 (rod 63), but has a stepped surface facing fixed blade 61 that enables movable blade 136 provided on robot hand 80C to be moved in a stroke to a position meshing with fixed blade 61. Removing of alternative embodiment feeder 40C is performed as follows. Similar to the first embodiment, robot hand 80C drives arm actuator 100 such that the claws of tip sections 84a of arms 84 hook around engaging pins 58 of feeder 40C, thereby clamping feeder 40C. Continuing, robot hand 80C drives rod actuator 90 such that rod 82 is advanced (moved to the right in FIG. 11), thereby tilting clamp lever 56. By this, the fixing of feeder 40C is released. Here, with alternative embodiment feeder 40C too, in a similar manner to feeder 40B, clamp lever 56 is not linked to the movable blade, so top film TF is not cut by the tilting of clamp lever 56. Further, robot hand 80C drives third rod actuator 130 such that support member 135 is advanced. By this, movable blade 136 fixed to support member 135 is moved to a position meshing with fixed blade 61 provided on feeder 40C, such that top film TF sandwiched between fixed blade 61 and movable blade 136 is cut.

With the first embodiment, as link mechanism 65, first link member 66 and second link member 67 are connected via elongated holes 66a formed in first link member 66, but embodiments are not limited to this, and movable blade 62 may have a slide section that is able to be moved in a stroke independently without clamp lever 56 being operated, elongated holes 66a may be formed in second link member 67, or may be formed clamp lever 56 or rod 63. Also, the link mechanism may be configured such that movable blade 62 cannot be moved in a stroke independently, that is the link mechanism may be configured without a slide section.

Robot hand 80 of the first embodiment is configured with drive motor 91 as an actuator (rod actuator 90) that operates clamp lever 56, and cylinder 102 as an actuator (arm actuator) that clamps feeder 40, but embodiments are not limited to this, and both actuators may be a drive motor, or both actuators may be a cylinder, or another type of actuator may be used.

Correspondences between main constituent elements of the embodiments and main constituent elements of the summary will be clarified here. Bottom tape BT corresponds to "tape main body", top film TF corresponds to "film", feeder 40 corresponds to "feeder", feeder housing stand 71 corresponds to "feeder housing section", pair of arms 84 and arm actuator 90 built into robot hand 80 correspond to "gripping device", case 81 capable of movement in the XYZ directions by X-axis slider 76 and X-axis actuator 76a, Y-axis slider 74 and Y-axis actuator 74a, and Z-axis slider 72 and Z-axis actuator 72a corresponds to "moving member", and fixed blade 61, movable blade 62, and rod actuator 90 correspond to "film cutting device". Further, clamp mechanism 54 corresponds to "clamp mechanism", clamp lever 56 corresponds to "operating member", wire 55 corresponds to "first converting mechanism", and link 65 corresponds to "second converting mechanism".

Meanwhile, it goes without saying that the disclosure is not limited to the above-mentioned embodiments and various embodiments may be applied within the technical scope of the disclosure.

INDUSTRIAL APPLICABILITY

The present disclosure may be applied to the industrial field of feeders and feeder exchanging devices.

The invention claimed is:

1. A feeder exchanging device that exchanges a loaded feeder that is loaded on a feeder stand of a component mounting system including a mounter unit that picks up a component supplied by a carrier tape of the loaded feeder on the feeder stand and mounts the component on a target object, the feeder exchanging device comprising:
   a feeder housing section that houses a plurality of feeders; and
   a moving, member that moves between the feeder housing section and the feeder stand, the moving member including a gripping device that selectively grips one of the loaded feeder and one of the plurality of feeders, wherein
   the feeder exchanging device exchanges the loaded feeder with the one of the plurality of feeders by the moving member and the gripping device,
   the loaded feeder includes a cutter that cuts a film peeled from the carrier tape, and
   when the gripping device grips the loaded feeder, the moving member causes the cutter to cut the film.

2. The feeder exchanging device according to claim wherein the moving member includes an actuator that drives the cutter to cut the film.

3. The feeder exchanging device according to claim 2, wherein the loaded feeder includes
   a clamp switchable between a fixed state and a released state with the feeder stand,
   a clamp lever that operates the clamp,
   a wire that converts operation of the clamp lever to operation of the clamp, and
   a link that converts operation of the clamp lever to operation of the cutter, and the actuator moves the clamp lever when the gripping device grips the loaded feeder.

4. The feeder exchanging device according to claim 3, wherein the cutter cuts the film by a stroke of a movable blade, the link joins the clamp lever and the movable blade, and the link is joined such that movable blade is relatively movable within a stroke range.

5. The feeder exchanging device according to claim 3, wherein the actuator moves the clamp lever to simultaneously operate the clamp and the cutter.

6. The feeder exchanging device according to claim 3, wherein the actuator includes a rod that projects from the gripping device to contact the clamp lever.

* * * * *